United States Patent
Tyler et al.

(10) Patent No.: US 7,456,441 B2
(45) Date of Patent: Nov. 25, 2008

(54) SINGLE WELL EXCESS CURRENT DISSIPATION CIRCUIT

(75) Inventors: Matthew A. Tyler, Kaysville, UT (US); John J. Naughton, Idaho Falls, ID (US)

(73) Assignee: Semiconductor Components Industries, LLC, Phoenix, AZ (US)

(*) Notice: Subject to any disclaimer, the term of this patent is extended or adjusted under 35 U.S.C. 154(b) by 58 days.

(21) Appl. No.: 11/532,477

(22) Filed: Sep. 15, 2006

(65) Prior Publication Data

US 2008/0067605 A1 Mar. 20, 2008

(51) Int. Cl.
*H01L 29/74* (2006.01)
(52) U.S. Cl. .............. 257/173; 257/355; 361/91.5
(58) Field of Classification Search ........... 257/173, 257/355, 362, 363; 361/91.5
See application file for complete search history.

(56) References Cited

U.S. PATENT DOCUMENTS

| | | | |
|---|---|---|---|
| 4,870,530 A | 9/1989 | Hurst et al. ............... 361/91 |
| 5,012,317 A | 4/1991 | Rountre ............... 357/38 |
| 5,400,202 A | 3/1995 | Metz et al. ............... 361/56 |
| 5,602,404 A | 2/1997 | Chen et al. ............... 257/112 |
| 5,675,469 A | 10/1997 | Racino et al. ............... 361/212 |
| 5,721,445 A | 2/1998 | Singh et al. ............... 257/369 |
| 5,780,905 A | 7/1998 | Chen et al. ............... 257/355 |
| 5,844,280 A * | 12/1998 | Kim ............... 257/355 |
| 6,344,385 B1 | 2/2002 | Jun et al. ............... 438/237 |
| 6,376,882 B1 | 4/2002 | Huang et al. ............... 257/355 |
| 6,538,266 B2 * | 3/2003 | Lee et al. ............... 257/173 |
| 6,548,360 B2 | 4/2003 | Huang et al. ............... 438/300 |
| 6,552,399 B2 | 4/2003 | Jun et al. ............... 257/357 |
| 6,717,219 B1 | 4/2004 | Vashchenko et al. ...... 257/355 |
| 6,770,918 B2 | 8/2004 | Russ et al. ............... 257/173 |
| 6,784,029 B1 | 8/2004 | Vashchenko et al. ...... 438/129 |
| 6,891,206 B2 * | 5/2005 | Czech et al. ............... 257/141 |
| 6,933,540 B2 | 8/2005 | Liu et al. ............... 257/173 |
| 6,933,546 B2 | 8/2005 | Khemka et al. ............ 257/199 |
| 7,067,852 B1 * | 6/2006 | Vashchenko et al. ...... 257/173 |

* cited by examiner

*Primary Examiner*—Mark Prenty
(74) *Attorney, Agent, or Firm*—Workman Nydegger

(57) ABSTRACT

A current dissipation circuit that dissipates excess current to or from a circuit node when that monitored circuit node experiences abnormal voltage conditions, rather than having that excess current being dissipated through other protected circuitry. The current dissipation circuit may use single well technology, and may even provide reverse voltage protection without necessarily triggering more significant current dissipation. In another embodiment, the current dissipation circuit is provided by a series connection of at least five alternating p-type and n-type regions provided between the monitored circuit node and a current source or sink.

18 Claims, 6 Drawing Sheets

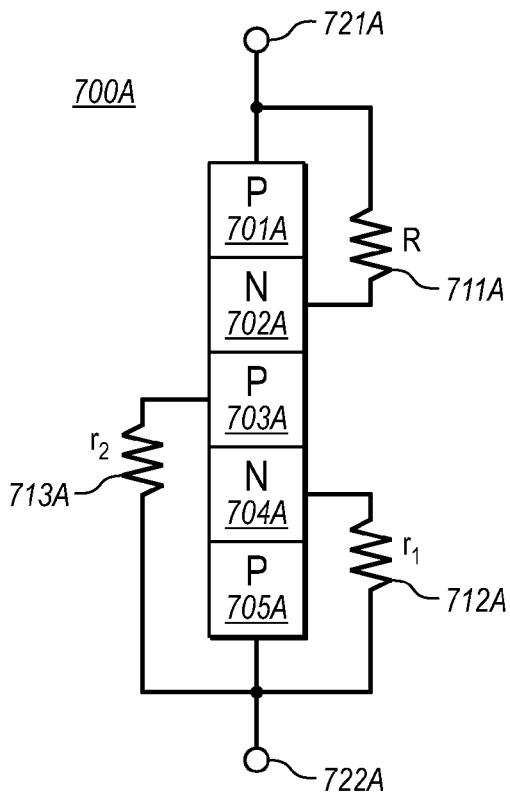
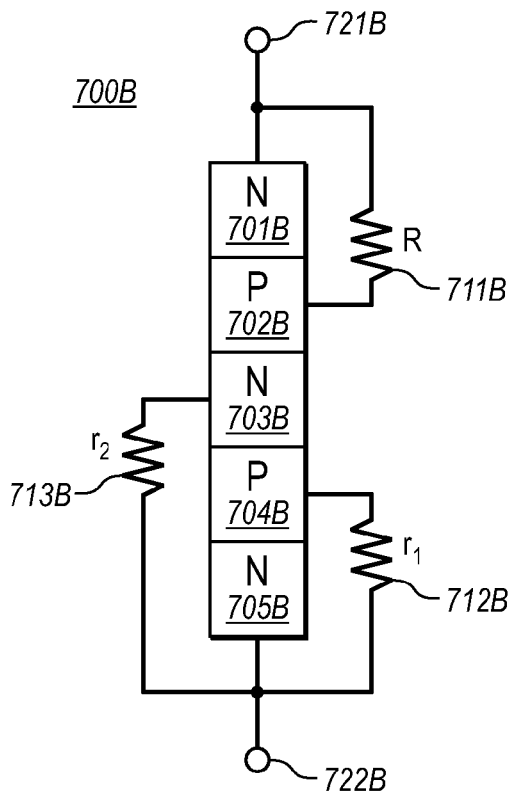
Fig. 7A
Fig. 7B
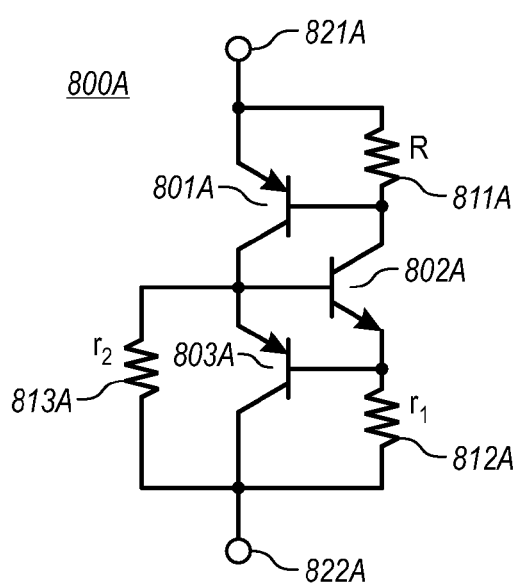
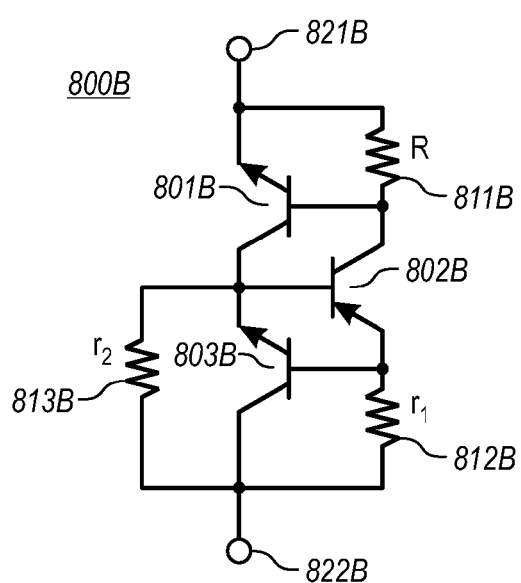
Fig. 8A
Fig. 8B

SINGLE WELL EXCESS CURRENT DISSIPATION CIRCUIT

BACKGROUND

Electronic circuitry provides complex functionality that is proving ever more useful. In one common form, circuitry is formed on a semiconductor or other substrate using microfabrication processing technology. Modern processing technology often permits circuits to be constructed with feature dimension sizes as small as below one micron (1 µm or $10^{-6}$ meters) for some processes. Accordingly, circuitry is becoming ever more integrated with advances in processing technology.

Typical circuitry with such small feature dimension sizes are not designed to carry large amounts of current. So long as the voltage range at any given node does not extended out of its designed range, these currents remain relatively low and the circuitry will typically operate as designed. However, if the voltage range at any given node extends outside of its designed range, a condition of Electrical OverStress (EOS) may occur.

For example, most common semiconductor fabrication processes use substrate or bulk semiconductor with different dopants implanted into certain regions of the substrate. These implant regions define unique voltage characteristics that are important or essential for circuit functionality. Thus, EOS experienced at any of the implant regions may adversely impact circuit performance. Another area where EOS may adversely affect performance is in the interlayer dielectrics, which have voltage limitations as well. Driving a circuit outside of its normal operating range can often disable performance of the circuit, reduce the operational lifetime of the circuit, or even immediately destroy the circuit. EOS can take many forms, but commonly takes the form of Electro Static Discharge (ESD) events.

Many current dissipation circuits have been designed that are suitable for dissipating current to or from corresponding critical circuit nodes in order to provide protection to corresponding circuitry. Such current dissipation circuits often take the form of Silicon or Semiconductor Controlled Rectifiers (SCRs). When the monitored circuit node for a particular SCR has a normal voltage applied thereon, the SCR has little impact on the operation of the corresponding protected circuitry. However, when the monitored circuit node exceeds the normal operating voltage range, the SCR draws or provides current as appropriate to thereby prevent excessive currents from being experienced within the protected circuitry.

Conventionally, SCR technology involves dual well technology using both n-wells and p-wells. This often involves more processing steps as compared to using single well technology such as would be employed if using only n-wells or if using only p-wells. Furthermore, there are situations in which the normal operating range of a critical circuit node is exceeded, yet for which it is desirable to draw only a little current through the SCR. For instance, some protected circuitry is designed to operate and provide some functionality in an alternative operating mode if the polarity of the voltage supplies provided to the circuit is reversed.

BRIEF SUMMARY OF THE INVENTION

Embodiments of the present invention relate to a current dissipation circuit that dissipates excess current to or from a circuit node when that monitored circuit node experiences abnormal voltage conditions, rather than having that excess current being dissipated through other protected circuitry. The dissipated current might otherwise have been born fully by the protected circuitry thereby potentially causing electrical overstress in that protected circuitry. Such EOS can temporarily disable the protected circuit. In some conditions, EOS, and especially ESD, may permanently damage the protected circuit, thereby reducing the effective life of the protected circuit.

In one embodiment, the current dissipation circuit is provided using single well technology such that perhaps only n-wells are used, or perhaps only p-wells are used. In some situations, this might simplify the processing associated with constructing a structure as compared to a structure that includes dual well technology in which both n-wells and p-wells are used. That said, the principles of the present invention are not limited to situations in which the use of the single well technology simplifies overall processing. In another embodiment, the current dissipation circuit is provided by a series connection of at least five alternating p-type and n-type regions provided between the circuit node and a current source or sink, regardless of the well technology, if any, that is employed.

These and other features of the embodiments of the present invention will become more fully apparent from the following description and appended claims, or may be learned by the practice of the invention as set forth hereinafter.

BRIEF DESCRIPTION OF THE DRAWINGS

To further clarify the above and other advantages and features of embodiments of the present invention, a more particular description of the embodiments of the invention will be rendered by reference to the appended drawings. It is appreciated that these drawings depict only typical embodiments of the invention and are therefore not to be considered limiting of its scope. The embodiments will be described and explained with additional specificity using the accompanying drawings in which:

FIG. 7A illustrates a series connection of alternating P-type and N-type regions in a PNPNP configuration used to describe the operation of the current dissipation circuit of FIG. 3;

FIG. 7B illustrates a series connection of alternating N-type and P-type regions in an NPNPN configuration;

FIG. 8A illustrates a current dissipation circuit of FIG. 3 and FIG. 7A expressed in the form of interconnected bipolar transistors; and FIG. 8B illustrates a current dissipation circuit of FIG. 3 and FIG. 7B expressed in the form of interconnected bipolar transistors.

DETAILED DESCRIPTION OF THE PREFERRED EMBODIMENTS

Figure 1:
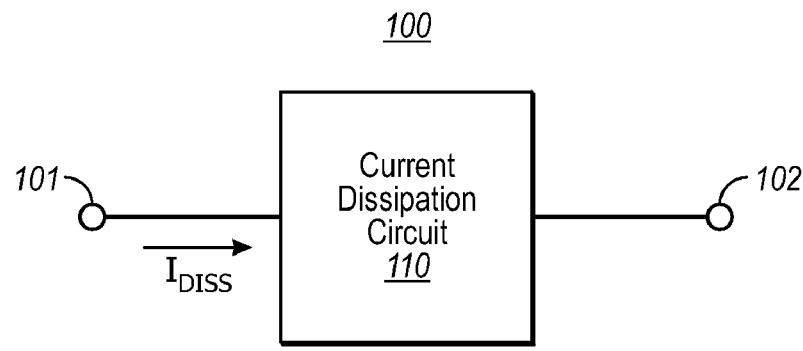
FIG. 1 illustrates a current dissipation circuit disposed between two circuit nodes.

Embodiments of the present invention relate to structure and operation of a current dissipation circuit. For example, referring to FIG. 1, a circuit 100 includes two circuit nodes 101 and 102, and a current dissipation circuit 110 interposed therebetween to induce a current $I_{DISS}$. If the induced current $I_{DISS}$ is positive, then the current dissipation circuit 100 draws current from the first circuit node 101 into one or more second circuit node(s) 102. If the induced current $I_{DISS}$ is negative, then the current dissipation circuit 100 provides current from the one or more second circuit nodes 102 into the first circuit node 101.

Figure 2A:
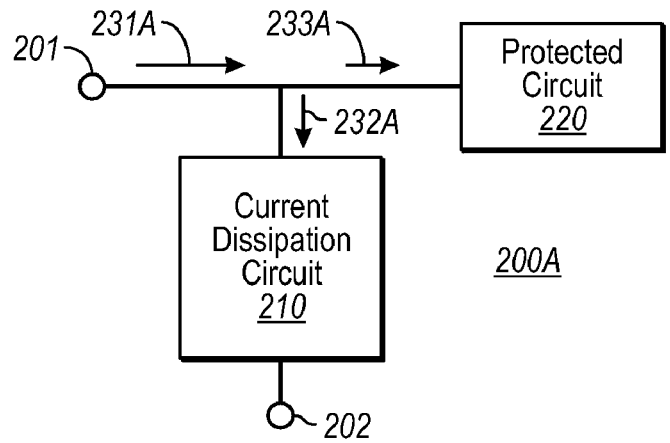
FIG. 2A illustrates a current dissipation circuit disposed to protect excess current from being provided to a protected circuit.
Figure 2B:
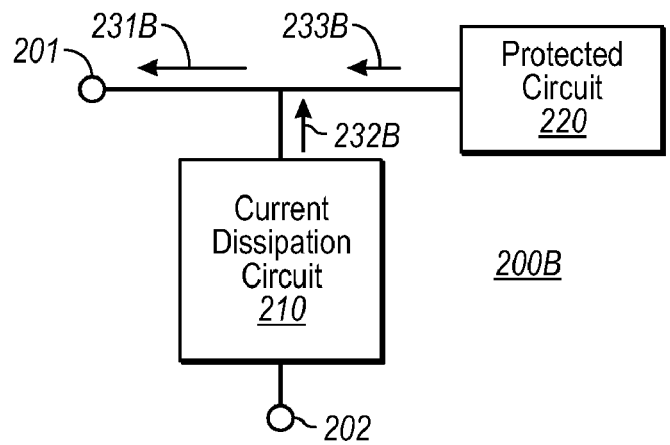
FIG. 2B illustrates the current dissipation circuit of FIG. 2A disposed to protect excess current from being drawn from the protected circuit.

FIGS. 2A and 2B each illustrate one example use of the current dissipation circuit 100 of FIG. 1. In each case of FIGS. 2A and 2B, the first circuit node 201 (corresponding to first circuit node 101 of FIG. 1) is coupled to second circuit node(s) 202 (corresponding to second circuit node(s) 102 of FIG. 1) through the current dissipation circuit 210 (corresponding to the current dissipation circuit 110 of FIG. 1). In addition, protected circuit 220 is shown coupled to the first circuit node 201.

If excessive current 231A is provided to the first circuit node 201 as illustrated in the case of FIG. 2A, then the current dissipation circuit 210 may draw current 232A from the first circuit node 201, thereby leaving a more manageable current 233A to be dissipated within the protected circuit 220. On the other hand, if excessive current 231B is drawn from the first circuit node 201 as illustrated in the case of FIG. 2B, the current dissipation provides current 232B to the first circuit node 201, thereby once again leaving a more manageable current 233B that is dissipated within the protected circuit 220. Excessive current may be provided to or drawn from the first circuit node 201 in cases of Electrical OverStress (EOS) such as, for example, ElectroStatic Discharge (ESD) being applied to the first circuit node 201 or to a component electrically close to the first circuit node 201.

Thus, the amount of current that passes through the current dissipation circuit is different depending on the state of the circuit, where the state is defined as controlled by a voltage applied at the first circuit node 101, or at least by a voltage differential between the first and second circuit nodes 101 and 102. In the case of FIGS. 2A and 2B, the voltage at the first circuit node 201 controls how the current dissipation circuit 210 acts. Accordingly, in the case of FIGS. 2A and 2B, the first circuit node 201 may also be referred to in this description as a "monitored" circuit node.

Conventional current dissipation circuits often come in the form of Silicon or Semiconductor Controlled Rectifiers (SCRs). Such SCRs often operate in one of two states, often referred to as a "non-regenerative mode" and "regenerative mode". So long as the voltage at the monitored circuit node (e.g., circuit node 201) is within a safe range, the current dissipation circuit is in non-regenerative mode in which it draws or provides little, if any, current, and thus has little effect on the protected circuitry. If the monitored circuit node has a voltage that is outside of that safe range, the current dissipation circuit is triggered into the regenerative mode thus drawing or providing (as appropriate) substantial amounts of current. Thus, when the voltage applied at the monitored circuit node transitions from within the safe range to outside the safe range, the current dissipation circuit begins immediately to dissipate relatively large amounts of current, thereby preserving the protected circuitry. This triggering can be relatively abrupt. The level of voltage required for such triggering can differ significantly depending on the application, since it is the application that will define the safe and unsafe ranges. Accordingly, any mention of specific trigger voltages made herein is strictly for example purposes only, and not to restrict the scope of the invention.

In accordance with one embodiment of the present invention, however, there may be an additional state in which a reverse voltage is applied between the first and second circuit nodes 101 and 102. Such a condition might be realistic in many applications. For instance, in battery powered circuitry, the battery may simply be applied with an unintentionally reversed electrical polarity. In those situations, the protected circuitry may be designed to provide some limited functionality given the reverse applied voltage.

Figure 3:
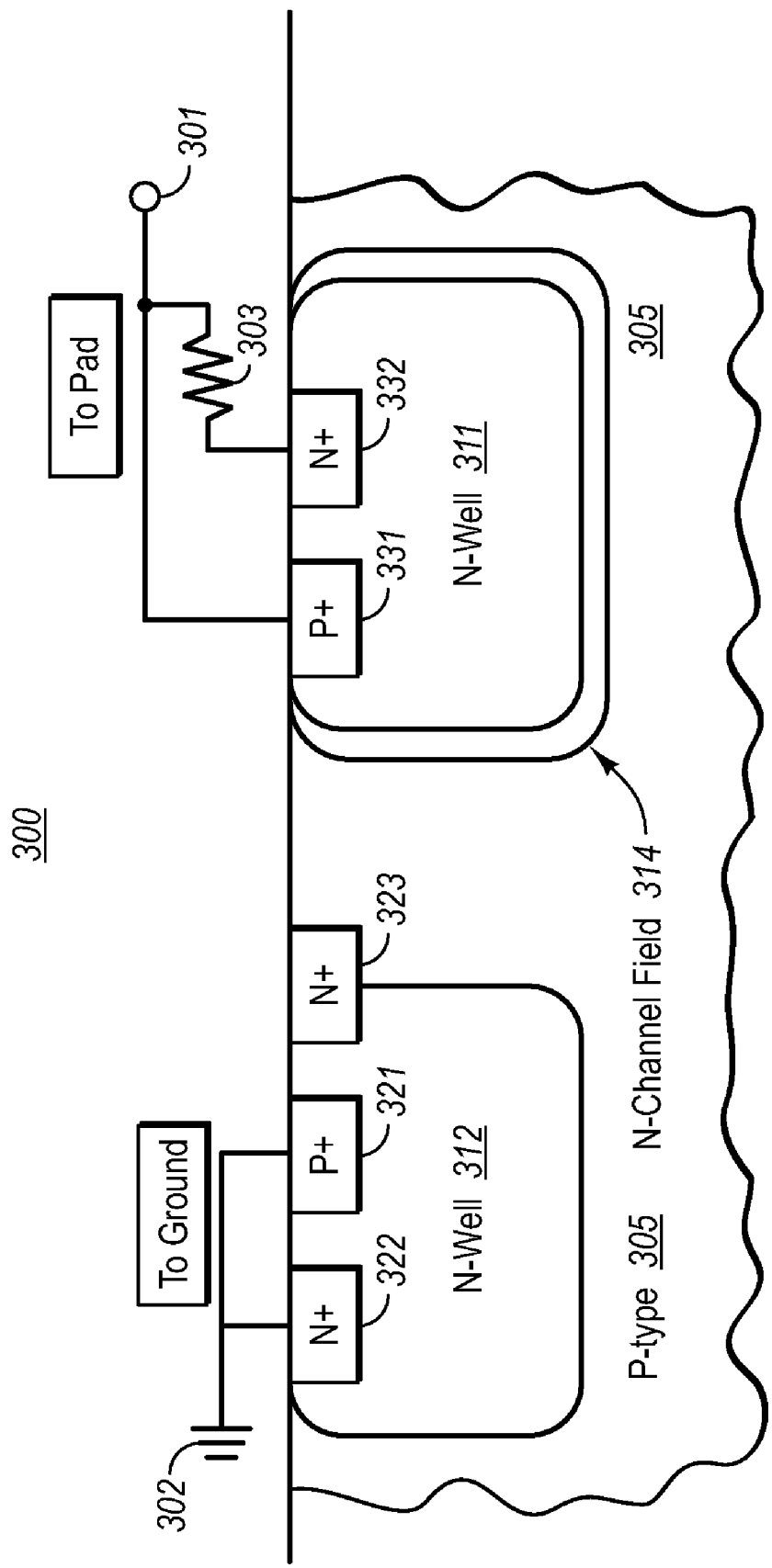
FIG. 3 illustrates a combined cross-sectional view and schematic diagram of a current dissipation circuit using single well technology in accordance with one embodiment of the present invention.

FIG. 3 illustrates a current dissipation circuit 300 manufactured on a semiconductor substrate that may be used to protect circuitry from EOS while permitting operation in a reverse voltage condition. For clarity, portions of the protection circuit 300 are illustrated in cross-section as they might be processed on a semiconductor substrate, while other portions are illustrated using simple circuit symbols. In addition to providing reverse voltage protection without triggering the current dissipation circuit 300, the current dissipation circuit 300 may also be processed using a single-well technology in which all wells are manufactured of the same polarity (i.e., all n-type or all p-type). In the illustrated case of FIG. 3, all of the wells are n-type.

In this description and in the claims, an "n-type" region or "n-region" of a semiconductor material is said to have an n-type polarity and is a region in which there are more n-type dopants than p-type dopants, if there are any p-type dopants at all. On the other hand, a "p-type" region or "p-region" of a semiconductor material is said to have a p-type polarity and is a region in which there are more p-type dopants than n-type dopants, if there are any n-type dopants. Generally, the p-type polarity is considered to be the opposite of the n-type polarity.

The current dissipation circuit 300 includes two autonomous n-well regions 311 and 312 within a p-type semiconductor substrate 305. An "n-well" region is a well that is formed as an n-type region within a larger p-type region, as opposed to a "p-well" region which is formed as a p-type region within a larger n-type region. Techniques for forming n-well and p-well regions in a substrate are well known in the art and thus will not be discussed here. It will be understood that a p-type semiconductor region in contact with an n-type semiconductor region will cause a diode effect, with current being permitted to pass from the p-type region to the n-type region if the voltage at the p-type region is higher than the voltage at the n-type region. However, current is not permitted to flow from the n-type region to the p-type region absent a significantly high voltage at the n-type region with respect to the p-type region. This higher voltage is often referred to as a diode's "breakdown" voltage or "reverse breakdown" voltage.

Occasionally, while describing the operation of the current dissipation circuit 300 of FIG. 3, reference will be made to the PNPNP stack 700A of FIG. 7A, which illustrates the relationship of the p-type and n-type junctions of FIG. 3. Likewise, FIG. 8A illustrates the relationship in the form of interconnected bipolar transistors 800A.

Since FIG. 7A is used to describe only the principles of operation, the size of the n-type and p-type regions of FIG. 7A are not drawn to scale when compared to the corresponding components of FIG. 3. In FIG. 7A, the n-region 702A corresponds to the n-well 311 of FIG. 3, and the n-region 704A corresponds to the n-well 312 of FIG. 3. The p-region 703A corresponds to the p-type substrate 305 of FIG. 3. Note that in FIG. 3, there may be an n-channel field 314 surrounding the n-well 311. The thickness of this n-channel field 314 may be controlled at the time of circuit manufacture to thereby control the breakdown voltage between the diode defined by the n-well 311 and the p-type substrate 305. Mechanisms for forming such an n-channel field of a specific width are known in the art and thus will not be described here. Although not shown, an n-tub of higher n-type dopant density than the n-well 311 may be used internal to the n-well 311 to provide a further adjustment to the breakdown voltage.

Referring to FIGS. 7A and 8A, the n-region 702A of FIG. 7A corresponds to the n-type base terminal of the PNP bipolar transistor 801A and the n-type collector terminal of the NPN bipolar transistor 802A, which are shown coupled together in FIG. 8A since the terminals are both formed using the same n-type region 702A. Also, the n-region 704A of FIG. 7A corresponds to the n-type emitter terminal of the NPN bipolar transistor 802A and corresponds to the n-type base terminal of the PNP bipolar transistor 803A. Once again, these terminals are coupled together since they are formed of the same n-type region 704A The p-region 703A of FIG. 7A corresponds to the p-type collector terminal of PNP bipolar transistor 801A, the p-type emitter terminal of PNP bipolar transistor 803A, and the p-type base terminal of NPN bipolar transistor 802A, which are shown coupled together.

Referring back to FIG. 3, the n-well 311 is coupled to a first circuit node 301 through a first parallel combination of a p-type contact region 331 and an n-type contact region 332. The net dopant density of each of the p-type contact region 331 and the n-type contact region 332 is greater than the net dopant density of the n-well 311. This higher net dopant density is expressed in FIG. 3 by the p-type contact region 331 being designated as "P+", and the n-type contact region 332 being designated as "N+". The "net dopant density" is the concentration per unit volume of dominant dopant species (n-type dopants if an n-type region, and p-type dopants if a p-type region) minus the concentration per unit volume of minority dopant species (p-type dopants if an n-type region, and n-type dopants if a p-type region).

Referring to FIGS. 3 and 7A, the p+ contact region 331 of FIG. 3 corresponds to the p-region 701A of FIG. 7A. The p-region 701A is coupled to one terminal 721A of the PNPNP stack 700A. The terminal 301 of FIG. 3 corresponds to the terminal 721A of FIG. 7A. The resistor 303 of FIG. 3 corresponds to the resistor 711A of FIG. 7A having resistance R. Referring to FIGS. 3 and 8A, the p+ contact region 331 of FIG. 3 corresponds to the p-type emitter terminal of the PNP bipolar transistor 801A. The terminal 301 of FIG. 3 corresponds to terminal 821A of FIG. 8A. The resistor 303 of FIG. 3 corresponds to the resistor 811A of FIG. 8A.

Referring back to the illustrated embodiment of FIG. 3, the n+ contact region 332 is coupled to the first circuit node 301 through a resistor circuit element 303. In this description and in the claims, a "resistor circuit element" is a resistor that is specifically formed as a desired portion of a circuit pattern. The p+ contact region 331 is coupled to the first circuit node 301 without an intervening resistor circuit element in H the illustrated embodiment.

A second n-well 312 is coupled to the second circuit node 302 through a parallel combination of a p+ contact region 321 and an n+ contact region 322. In the illustrated embodiment, the third and fourth contact regions 321 and 322 are coupled to the second circuit node 302 without an intervening resistor element. In one embodiment, the first circuit node 301 is an I/O pad in which input and/or output signals may be applied. The second circuit node 302 may be a substantially fixed voltage supply such as, for example, ground. The substrate 305 may also be connected to ground. The remaining circuit elements 323 serve to reduce the breakdown voltage of the diode defined by the interface between the n-well 312 to p-type substrate 305.

Referring to FIGS. 3 and 7A, the p+ contact region 321 of FIG. 3 corresponds to the p-region 705A of FIG. 7A. The second circuit node 302 of FIG. 3 corresponds to the circuit node 722A of FIG. 7A. Since the n-well 312 is connected through the n+ region 322 to the circuit node 302 with some resistance, FIG. 7A shows a small resistor 712A having resistance r1 coupled between the n-region 704A and the second circuit node 722A. Furthermore, since p-type substrate 305 may well be grounded, and the second circuit node 302 is grounded, the p-region 703A is shown coupled to the second circuit node 722A (which may be grounded) through resistor 713A having resistance r2. The resistors r1 and r2 may be parasitic, as opposed to an expressed resistor circuit element in the design. However, the resistors may also be expressed design elements.

Referring to FIGS. 3 and 8A, the p+ contact region 321 of FIG. 3 corresponds to the p-type collector terminal of PNP bipolar transistor 803A of FIG. 8A. The second circuit node 302 of FIG. 3 corresponds to the circuit node 822A of FIG. 8A. Since the n-well 312 is connected through the n+ region 322 to the circuit node 302 with some resistance, FIG. 8A shows a small resistor 812A having resistance r1 coupled between the n-type base terminal of PNP bipolar transistor 803A and the second circuit node 822A. Furthermore, since p-type substrate 305 may well be grounded, and the second circuit node 302 may well be grounded, the p-type base terminal of NPN bipolar transistor 802A is shown coupled to the second circuit node 822A through resistor 813A having resistance r2.

Referring back to FIG. 3, in normal operation mode, the first circuit node 301 will carry a moderately higher voltage than the second circuit node 302. In one secondary operation mode (referred to hereinafter as "moderate reverse voltage mode"), the first circuit node 301 may carry a moderately negative voltage as compared to the second circuit node 302. This might occur, for example, if the circuit was battery-connected, and the battery was incorrectly configured in reverse.

In a third operating mode (referred to herein as a "positive excessive voltage mode"), the first circuit node 301 has an excessive positive voltage as compared to the second circuit node 302. In a fourth operating mode (referred to herein as a "negative excessive voltage mode"), the first circuit node 301 has an excessive negative voltage as compared to the second circuit node 302. These third and fourth operating modes might be characteristic of some Electrical OverStress (EOS) condition such as, for example, ElectroStatic Discharge (ESD) occurring at the first circuit node 301.

Figure 6:
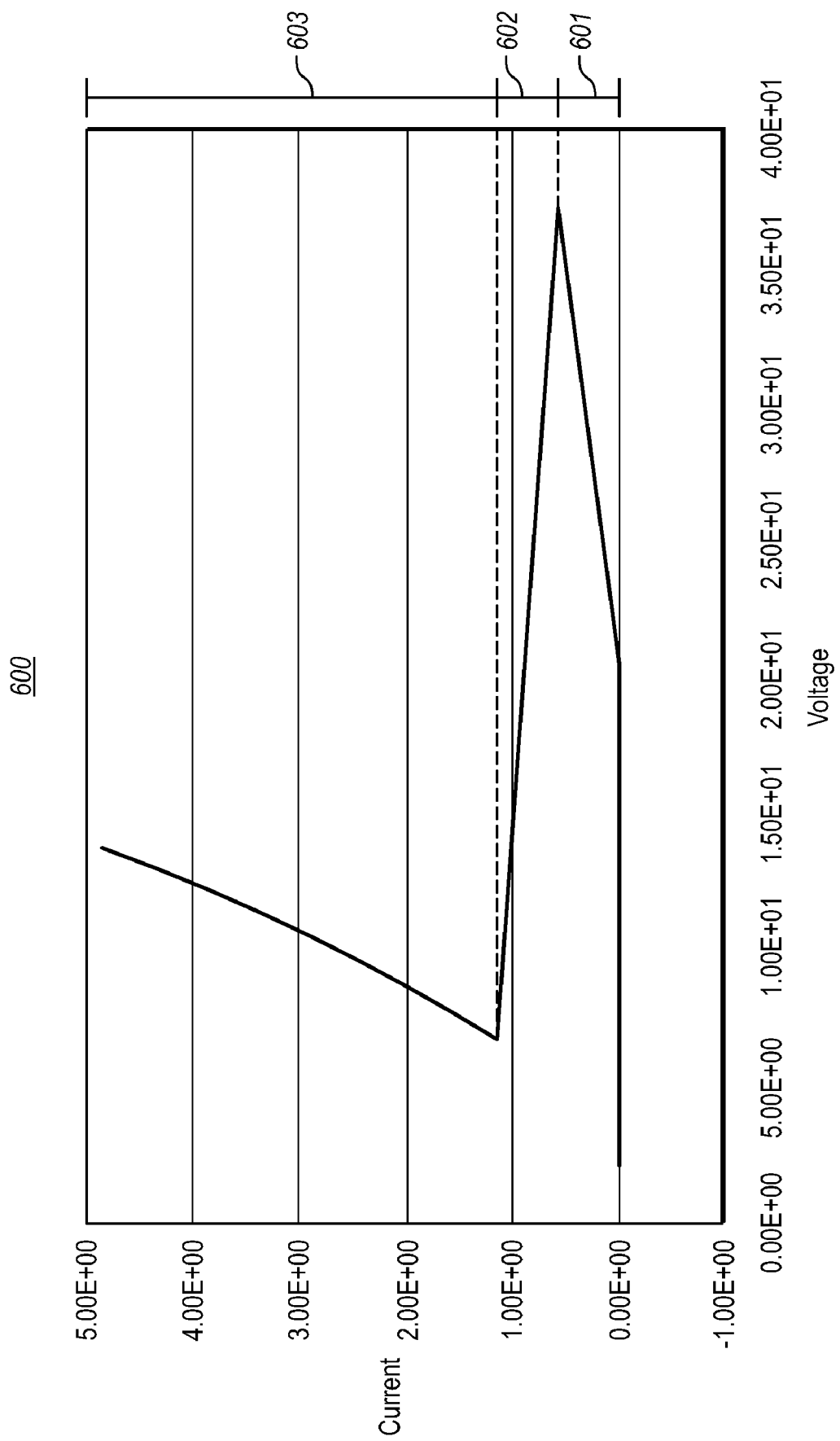
FIG. 6 illustrates another example voltage-current characteristic of the current dissipation circuit of FIG. 3 given a negative voltage on the input terminal relative to the substrate.

Referring to the voltage-current characteristic graph 600 of FIG. 6, the evaluation begins with the current applied through the current dissipation circuit being negligible. When the first circuit node 301 is driven to a voltage below that of the substrate 305 as in the moderate reverse voltage mode, the parasitic diode junction defined by the pn junction at the interface of the substrate 305 and n-well 311 becomes forward-biased. The negative voltage at the first circuit node 301 is not yet sufficient at this stage to overcome with breakdown voltage of the pn junction between n-well 311 and p+ contact region 331. However, after some amount of capacitive precharging, the current is free to flow from the p-type substrate 305 to the n-well 311, through the n+ contact region 332, through the resistor 303 and to the first circuit node 301. The presence of the resistor 303, however, serves to limit the amount of current that flows through the resistor 303. Referring to FIG. 7A, in this moderate reverse voltage mode, current may flow from the p-type region 703A to the n-type region 702A, and through the resistor 711A.

Referring to FIG. 6, in this moderate reverse voltage mode in which the voltage transitions from zero to somewhere below approximate 37 volts, the current remains still relatively small (below 1 Amp) within region 601. If the protected circuitry has functionality for operating under this moderate reverse voltage condition, the circuitry may continue to thus operate, since the current dissipation circuit is not dissipating significant amounts of current.

If the reverse voltage were to increase, however, to the triggering voltage (approximately 37 volts in the case of FIG. 6), the current dissipation circuit would enter excessive negative voltage mode. In this case, the current through (and the voltage across) the resistor 303 becomes sufficiently large, that the diode defined by the p+ region 331 and the n-well 311 enters avalanche breakdown. In this case, the current flowing from n-well 311 through p+ contact region 331 and to the first circuit node 301 increased dramatically thereby causing the voltage at circuit node 301 to drop. This transition is represented in FIG. 6 by region 602. This avalanche breakdown voltage may be adjusted as needed for the application, as will be apparent to one of ordinary skill in the art after having reviewed this description. For instance, the dopant profile of the p+ contact region 331 may be made less abrupt to increase the breakdown voltage, or more abrupt to decrease the breakdown voltage. Furthermore, the n-channel field 314 thickness, and the n+ region 323 position may be altered to adjust the breakdown voltage. There may be other parameters that may be adjusted at design time to control the breakdown voltage, as will be known to those of ordinary skill in the art after having reviewed this invention. For instance, the distance between n+ region 323 and either the n-well 311 or the n-channel field 314 may be adjusted during the design to thereby move the breakdown voltage to a desired tolerance.

Once the current rises above a particular level, the current dissipation circuit enters a positive feedback mode in which more and more current is dissipated with only minor voltage changes present at the first circuit node 301. This positive feedback mode will be further explained with respect to FIGS. 7A and 8A and is represented in FIG. 6 by region 603.

In negative excessive voltage mode, the current passing from p-region 703A to n-region 702A through resistor 711A becomes large enough that the voltage drop across resistor 711A exceeds the reverse breakdown voltage of the pn junction defined by the n-region 702A and p-region 701A. Accordingly, significant current passes from the n-region 702A through the p-region 701A and to the first circuit node 721A. Referring to FIG. 8A, this means that the bipolar transistor 801A activates, thereby permitting more and more current to pass between circuit nodes 821A and 821B as the negative voltage differential increases.

Accordingly, in excessive negative voltage mode, the current dissipation circuit 300 provides significant current to the first voltage node 301, such that the current drawn from the first circuit node 301 does not cause excessive current to be drawn from the protected circuit itself as in the case of FIG. 2B.

Figure 5:
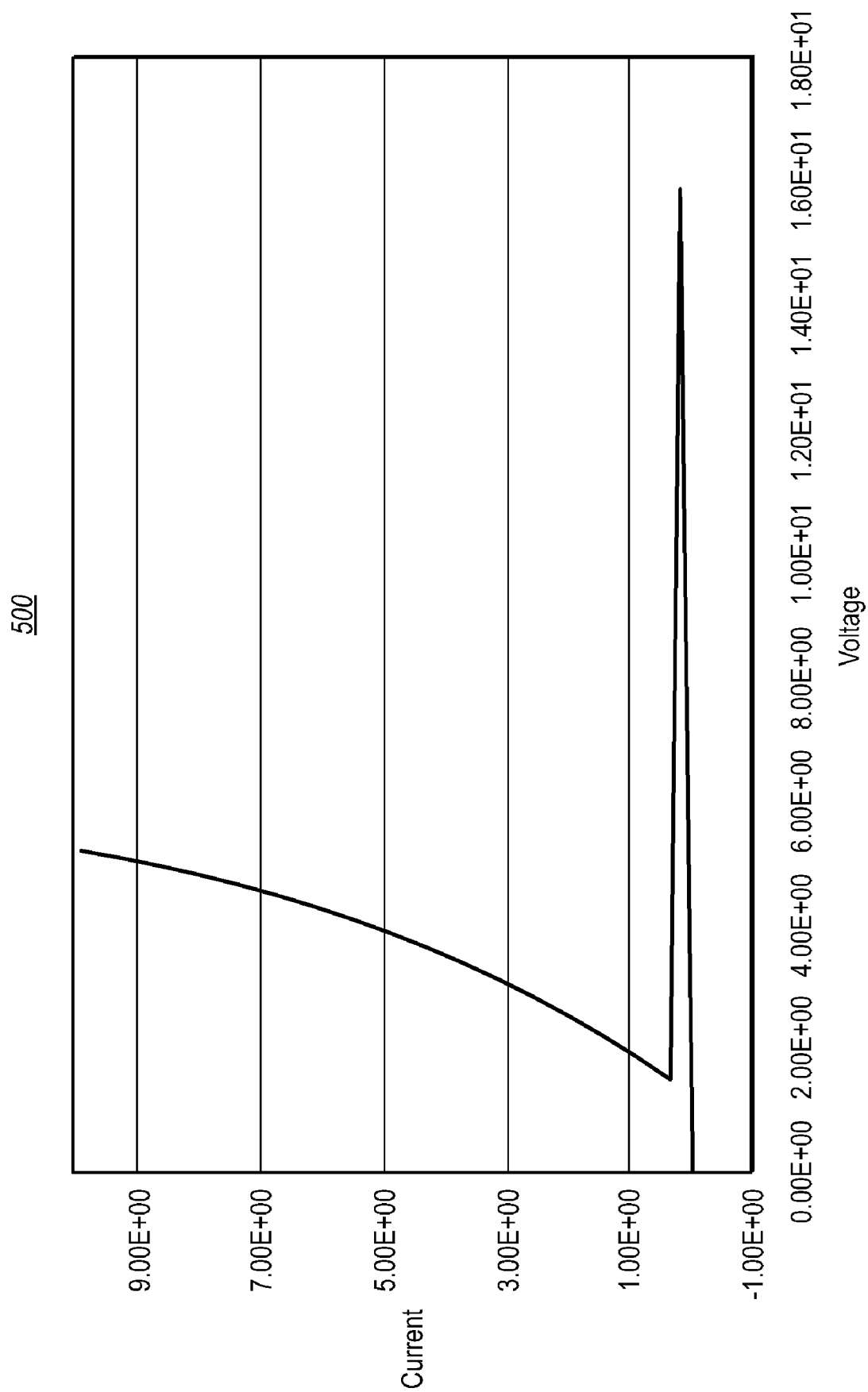
FIG. 5 illustrates one example voltage-current characteristic of the current dissipation circuit of FIG. 3 given a positive voltage on the input terminal as relative to the substrate.

FIG. 5, on the other hand, illustrates one example of voltage-current characteristics of the current dissipation circuit 300 of FIG. 3 in the case in which a positive voltage is applied on the first circuit node 301 as compared to the second current node 302. So long as this positive voltage remains below a certain positive trigger voltage (about 16 volts in the example of FIG. 5), the current drawn by the current dissipation circuit 300 remains negligible due to the reverse bias of the parasitic diode between the n-well 311 and the p-type substrate 305. Referring to FIG. 7A, the reverse bias voltage at the pn junction defined by the n-region 702A and the p-region 703A is not sufficient to allow significant current to flow from n-region 702A to p-region 703A. Accordingly, negligible current would pass through the current dissipation circuit 300.

When the positive voltage rises above the positive trigger voltage due to, for example, an EOS event applied on the first circuit node 301, the n-well 311 is charged up by the first circuit node 301 through the p+ contact region 332. Referring to FIG. 7A, the n-region 702A would charge up through p-region 701A. In FIG. 8A, the current would flow from the emitter terminal into the base terminal of the bipolar transistor 801A. This serves to activate the flow of current through the current dissipation circuit 300 into the second circuit node 300. As represented by FIG. 5, for example, with this increasing current, the voltage at the first circuit node 301 drops significantly, thereby protecting the protected circuitry from excessive current flow in the same way as shown in FIG. 2B.

As will be apparent to those of ordinary skill in the art, the polarities of each of the regions of FIGS. 3, 7A and 8A, may be reversed. In other words, p-type regions may be replaced by n-type regions, and vice verse. FIG. 7B illustrates a stack 700B which shows a series of NPNPN regions 701B through 705B, which applies this principles to FIG. 7A, with resistors 711B through 713B corresponding to resistors 711A through 713A. FIG. 8B illustrates a bipolar transistor configuration 800B that includes bipolar transistors 801B through 803B and resistors 811B through 813B, that applies this principle to FIG. 8A.

Figure 4:
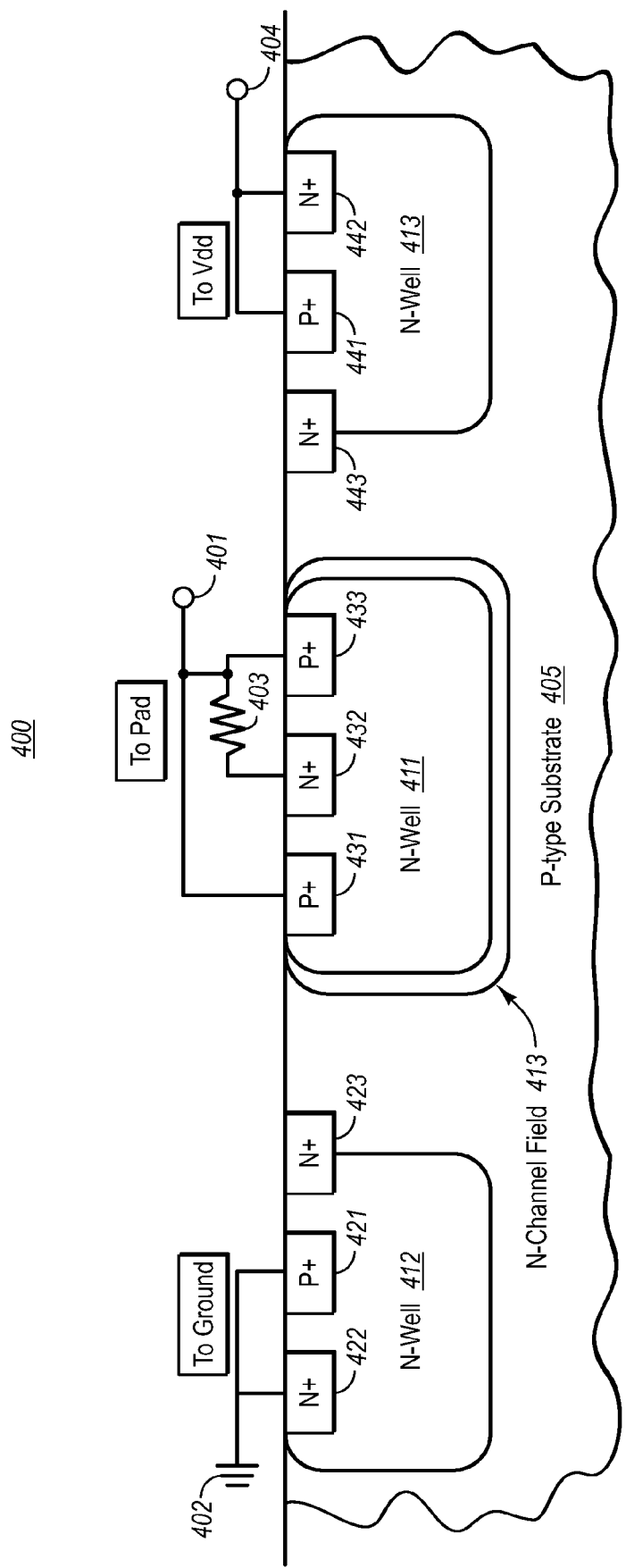
FIG. 4 illustrates a combined cross-sectional view and schematic diagram of a current dissipation circuit that uses single well technology and that has multiple current dissipation conduction paths.

FIG. 4 illustrates a dual reference mode form of the current dissipation circuit 300 of FIG. 3. While the current dissipation circuit 300 of FIG. 3 uses a single reference node 302 as a current source or sink, the current dissipation circuit 400 of FIG. 4 includes two references nodes 402 and 404 to source current to or sink current from the circuit node 401. The operation of the components 401, 402, 403, 405, 411, 412, 421, 422, 423, 431 and 432 of FIG. 4 will operate much as described above for the components 311, 312, 321, 322, 323, 331 and 332 described with respect to FIG. 3 in sourcing or sinking current to or sinking current from circuit node 401 using reference node 402. However, the reference node 404 will operate using regions 441, 442 and 443 within n-well 413 much as described above for the reference node 302 operating using regions 321, 322 and 323 within n-well 312. Accordingly, dual reference node current dissipation is achieved.

Therefore, a current dissipation circuit is described that permits for proper and adjustable current dissipation while permitted normal reverse voltage operation. Furthermore, this is achieved by using single well technology thereby simplifying the fabrication of the current dissipation circuit. The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A circuit for carrying current between a first circuit node and a second circuit node in a manner that is different depending on a state of the circuit, the state being dependent on a voltage at either or both of the first circuit node and the second circuit node, the circuit comprising:
   a first well having a first polarity and coupled to the first circuit node through a first parallel combination of a first contact region having the first polarity and a second contact region having a second polarity that is opposite the first polarity, wherein a net dopant density of each of the first and second contact regions is higher than a net dopant density of the first well, wherein the first contact region is coupled to the first circuit node through a resistor circuit element; and
   a second well having the first polarity and separated from the first well by an intervening region of the second polarity, the second well being coupled to the second circuit node through a second parallel combination of a third contact region having the first polarity and a fourth contact region having the second polarity, wherein a net dopant density of each of the third and fourth contact regions is higher than a net dopant density of the second well.

2. A circuit in accordance with claim 1, wherein the second contact region is coupled to the first circuit node without an intervening resistor circuit element.

3. A circuit in accordance with claim 2, wherein the third and fourth contact regions are coupled to the second circuit node without an intervening resistor element.

4. A circuit in accordance with claim 1, wherein the second circuit node is fixed to a substantially fixed voltage supply.

5. A circuit in accordance with claim 4, wherein the first circuit node is an I/O pad.

6. A circuit in accordance with claim 4, wherein the intervening region is a first intervening region and the substantially fixed voltage supply is a first substantially fixed voltage supply, the circuit further comprising:
   a third well having the first polarity and separated from the first well by a second intervening region of the second polarity, the third well being coupled to a third circuit node through a third parallel combination of a fifth contact region having the first polarity and a sixth contact region having the second polarity, wherein a net dopant density of each of the fifth and sixth contact regions is higher than a net dopant density of the third well.

7. A circuit in accordance with claim 1, wherein the first circuit node is an I/O pad.

8. A circuit in accordance with claim 1, wherein the first polarity is n-type and the second polarity is p-type.

9. A circuit in accordance with claim 1, wherein the first polarity is p-type and the second polarity is n-type.

10. A circuit comprising:
    an input pad;
    core circuitry coupled to the input pad;
    a current protection portion coupled to the input pad so as to limit the amount of current provided to or from the input pad to the core circuit during positive or negative exception conditions, the current protection portion comprising a series connection of the following in order between the input pad and a current source or sink:
    a first region of a first polarity type;
    a first region of a second polarity type opposite the first polarity type, wherein the first region of the second polarity type is coupled to the input pad via a resistor circuit element;
    a second region of the first polarity type;
    a second region of the second polarity type; and
    a third region of the first polarity type.

11. A circuit in accordance with claim 10, wherein the first polarity type is n-type and the second polarity type is p-type.

12. A circuit in accordance with claim 10, wherein the first polarity type is p-type and the second polarity type is n-type.

13. A circuit comprising:
    an input pad;
    core circuitry coupled to the input pad;
    a current protection portion coupled to the input pad so as to limit the amount of current provided to or from the input pad to the core circuit during positive or negative exception conditions, the current protection portion comprising a series connection of the following in order between the input pad and a current source or sink:
    a first region of a first polarity type;
    a first region of a second polarity type opposite the first polarity type, wherein the first region of the second polarity type is coupled to the input pad via a resistor circuit element;
    a second region of the first polarity type, wherein the second region of the first polarity type is coupled to a first substantially fixed voltage source;
    a second region of the second polarity type; and
    a third region of the first polarity type.

14. A circuit in accordance with claim 13, wherein the second region of the second polarity type is coupled to a second substantially fixed voltage source.

15. A circuit comprising:
    an input pad;
    a first bipolar transistor having its emitter terminal coupled to the input pad, the first bipolar transistor having its base terminal coupled to its emitter terminal via a resistor circuit element;
    a second bipolar transistor having its collector terminal coupled to the base terminal of the first bipolar transistor, the second bipolar transistor having a base terminal coupled to the collector terminal of the first bipolar transistor;
    a third bipolar transistor having its emitter terminal coupled to the base terminal of the second bipolar transistor and to a first voltage source, the third bipolar transistor having its base terminal coupled to the emitter terminal of the second bipolar transistor, the third bipolar transistor having its collector terminal coupled to a second voltage source.

16. A circuit in accordance with claim 15, wherein the first and second voltage sources are the same.

17. A circuit in accordance with claim 15, wherein the first and third bipolar transistors are PNP bipolar transistors, and the second bipolar transistor is an NPN bipolar transistor.

18. A circuit in accordance with claim 15, wherein the first and third bipolar transistors are NPN bipolar transistors, and the second bipolar transistor is a PNP bipolar transistor.

* * * * *